(12) United States Patent
Kim

(10) Patent No.: US 9,178,122 B2
(45) Date of Patent: Nov. 3, 2015

(54) METHOD OF MANUFACTURING LIGHT EMITTING DEVICE PACKAGE HAVING REFLECTOR AND PHOSPHOR LAYER

(71) Applicant: Jung Hoon Kim, Hwaseong-si (KR)

(72) Inventor: Jung Hoon Kim, Hwaseong-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 239 days.

(21) Appl. No.: 13/672,010

(22) Filed: Nov. 8, 2012

(65) Prior Publication Data

US 2013/0113009 A1    May 9, 2013

(30) Foreign Application Priority Data

Nov. 9, 2011   (KR) .................. 10-2011-0116425

(51) Int. Cl.
| | | |
|---|---|---|
| *H01L 21/00* | (2006.01) | |
| *H01L 33/60* | (2010.01) | |
| *H01L 33/62* | (2010.01) | |
| *H01L 23/00* | (2006.01) | |

(52) U.S. Cl.
CPC ............... *H01L 33/60* (2013.01); *H01L 24/97* (2013.01); *H01L 33/62* (2013.01); *H01L 2224/32245* (2013.01); *H01L 2224/48091* (2013.01); *H01L 2224/48247* (2013.01); *H01L 2224/73265* (2013.01); *H01L 2224/97* (2013.01); *H01L 2924/12041* (2013.01); *H01L 2933/0058* (2013.01); *H01L 2933/0066* (2013.01)

(58) Field of Classification Search
CPC ....... H01L 33/20; H01L 33/405; H01L 33/60; H01L 33/502; H01L 33/52; H01L 51/0096; H01L 51/5271; H01L 2924/00; H01L 2224/32245; H01L 2224/48247; H01L 2224/73265; H01L 2224/48091; H01L 2224/97; H01L 2924/12041; H01L 2924/00014; H01L 24/97; H01L 2933/0058; H01L 2933/0066
USPC ................................ 257/98, E33.072; 438/27
See application file for complete search history.

(56) References Cited

U.S. PATENT DOCUMENTS

| | | | |
|---|---|---|---|
| 7,329,905 B2 | 2/2008 | Ibbetson et al. | |
| 7,955,545 B2 * | 6/2011 | Lee et al. | 264/293 |
| 8,030,138 B1 * | 10/2011 | How et al. | 438/126 |
| 2005/0266693 A1 * | 12/2005 | Maekawa | 438/720 |
| 2006/0006404 A1 * | 1/2006 | Ibbetson et al. | 257/99 |
| 2009/0057960 A1 * | 3/2009 | Kashiwagi | 264/488 |
| 2010/0090191 A1 * | 4/2010 | Lee et al. | 257/3 |
| 2010/0258830 A1 * | 10/2010 | Ide et al. | 257/98 |
| 2010/0320482 A1 * | 12/2010 | Tachibana | 257/88 |
| 2011/0278610 A1 * | 11/2011 | Jeong et al. | 257/98 |

FOREIGN PATENT DOCUMENTS

| | | |
|---|---|---|
| JP | 2009-218274 | 9/2009 |
| KR | 1020110013636 | 2/2011 |

* cited by examiner

*Primary Examiner* — Duy T Nguyen
(74) *Attorney, Agent, or Firm* — Ellsworth IP Group PLLC

(57) ABSTRACT

A method of manufacturing a light emitting device (LED) package includes forming a reflector using nano-imprinting to increase an intensity of light extracted toward an external environment by increasing an angle of a reflector.

15 Claims, 22 Drawing Sheets

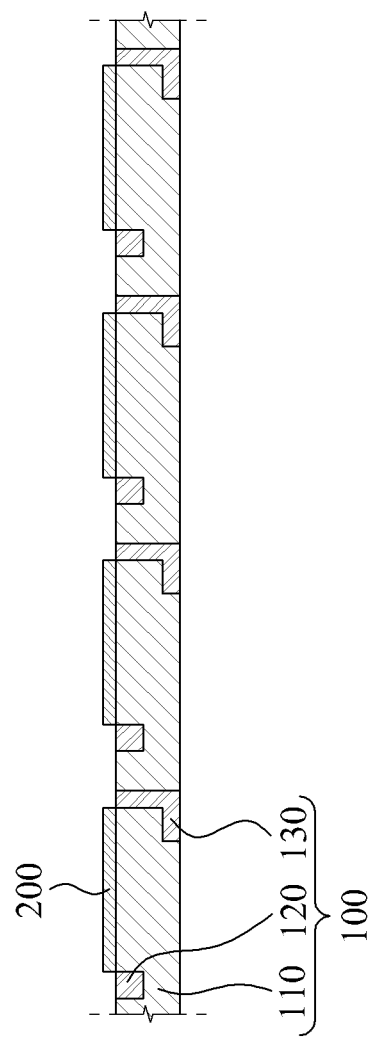

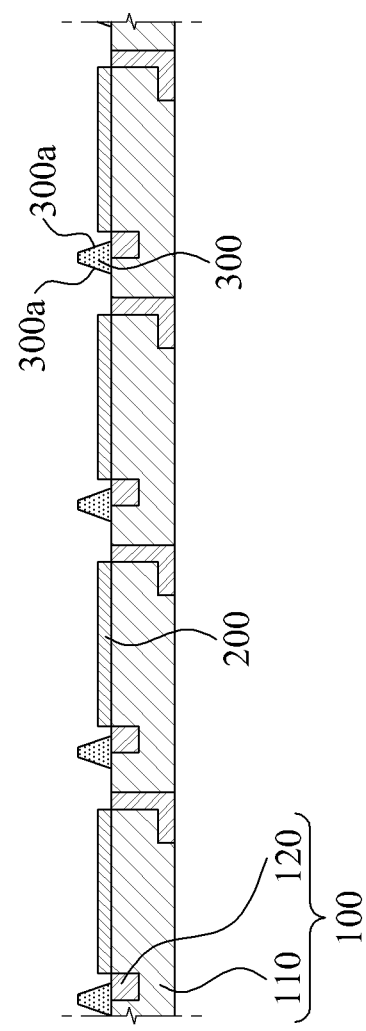

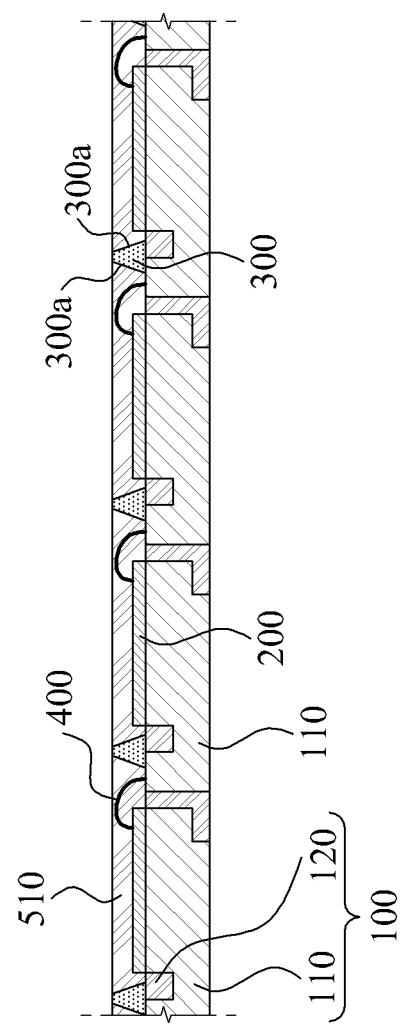

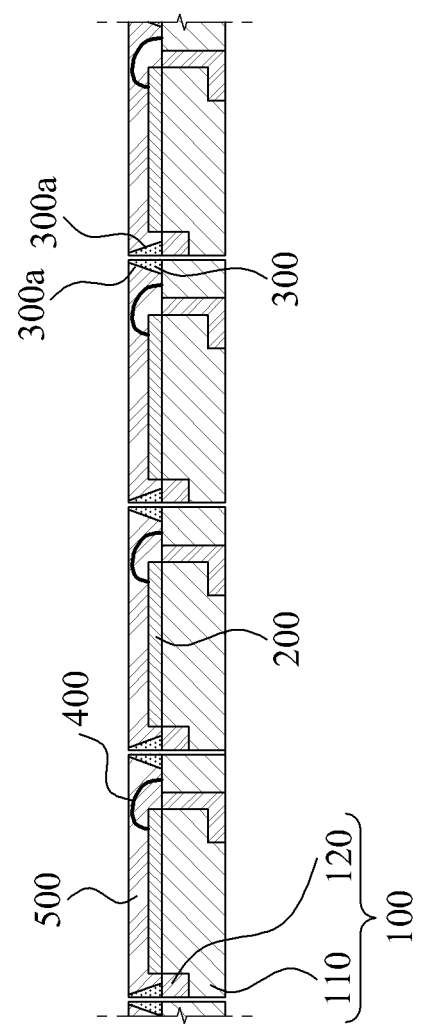

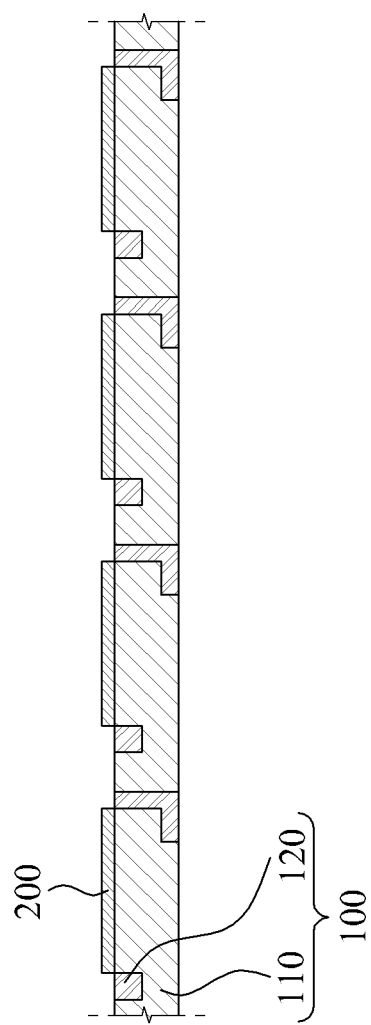

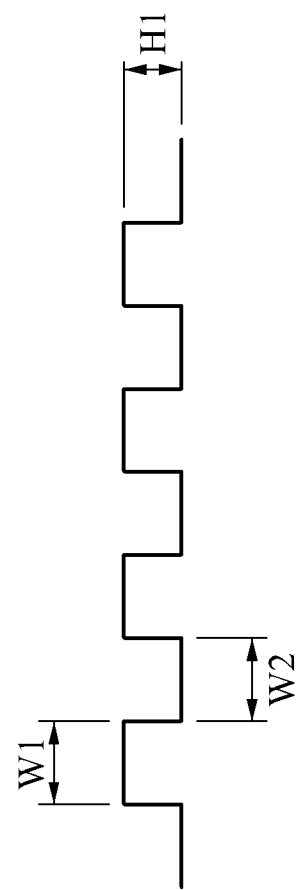

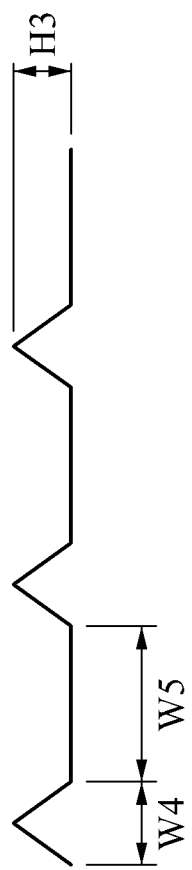

METHOD OF MANUFACTURING LIGHT EMITTING DEVICE PACKAGE HAVING REFLECTOR AND PHOSPHOR LAYER

CROSS-REFERENCE TO RELATED APPLICATIONS

This application claims priority under 35 U.S.C. §119 from Korean Patent Application No. 10-2011-0116425, filed on Nov. 9, 2011, in the Korean Intellectual Property Office, the disclosure of which is incorporated herein by reference in its entirety.

BACKGROUND

1. Field

The present general inventive concept relates to a method of manufacturing a light emitting device (LED) package, and more particularly, to a method of manufacturing an LED package that may include forming a reflector to increase an intensity of light emitted from an LED thereof.

2. Description of the Related Art

A light emitting device (LED) is a semi-conductor light emitting apparatus that emits light when a current flows. The LED may have features of a long life-span, a low power consumption, a fast response speed, an excellent initial operation, and the like and thus, may be widely applied to a lighting device, a headlight and a courtesy light of a car, an electronic display board, a backlight of a display device, and the like. The number of fields that adapt the LED has increased.

Recently, the LED is used as a light source of various colors. As the demand for a high power and high luminance LED, such as a white LED for lighting and the like, increases, research for improving the performance and reliability of an LED package has been actively conducted. To improve the performance of an LED product, an LED package that effectively extracts light, that has an excellent color purity, and that has a uniform property among products may be needed in addition to an LED with an excellent optical efficiency.

Phosphors may be disposed on a blue LED or an ultraviolet LED to obtain a white light using the LED. The white LED may color-transform a portion of light extracted from the blue LED or the ultraviolet LED, based on a combination of a red phosphor, a green phosphor, a blue phosphor, and a yellow phosphor, and may provide a white light by mixing the phosphors. A light extraction efficiency may correspond to the most important factor for determining the performance of the white LED.

A reflector may be used in an LED package structure to increase an intensity of light by increasing an extraction efficiency of light emitted from an LED chip. Also, an angle of a reflector cup may have a great effect on the intensity of light. When the angle of the reflector cup is small, the intensity of light extracted may be relatively low since an angle of reflection is small, and the light may fail to be emitted to an external environment, as a result of total internal reflection. Conversely, when the angle of the reflector cup is set to be great, the intensity of light extracted may increase since the angle of reflection increases.

An LED package formed using a currently available injection molding has a problem in that a size of the LED package increases when an angle of a reflector cup increases. In an LED package structure, a scattering path increases while light, generated by a blue LED, is being converted by a phosphor and thus, conformal coating for applying a phosphor of a predetermined thickness on an LED chip may be used to increase an intensity of light.

However, an LED chip formed using the conformal coating generally has a structure without a reflector. In a case of a structure including the reflector, the LED chip may be mounted to a pre-mold reflector package of a cup shape, formed using the conventional injection molding. In this instance, a phosphor layer may be formed using a method of covering the LED chip by injecting a phosphor material using a dispensing process.

When the reflector is formed in the aforementioned manner, a rate of increase in the intensity of light varies depending on the angle of the reflector cup. When a size of an LED chip is constant, the angle of the reflector cup may increase, in doing so a size of the LED package may increase as well. Also, a scattering path may increase unnecessarily while the light generated by the LED chip is being converted by a phosphor. Accordingly, a rate of increase in the intensity of light may decrease.

Nanoimprint lithography refers to a method of transferring a shape of a minute pattern by pressing a resin material applied onto a substrate with a mold in which the minute pattern is carved through electron beam exposure or etching technologies. Here, the mold is also referred to as a stamp or a template. For example, when nanoimprinting is performed using thermoplastic, a minute pattern may be transferred by pressing, with a mold, a resin that may be softened by heating the resin to a temperature over a glass transition temperature.

The nanoimprint lithography corresponds to a technology for manufacturing a nanoscale structure at a low cost, and is regarded as a replacement for unproductive electron beam lithography or expensive optical lithography.

SUMMARY

The present general inventive concept provides a method of manufacturing a light emitting device (LED) package that may include forming a reflector to increase an intensity of light emitted from an LED thereof.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a method of manufacturing an LED package, the method including mounting an LED chip on a substrate, spraying, on the substrate, a material usable to manufacture a reflector, and pressing the material with a first stamp having a patterned surface using nano imprinting, forming a reflector by etching the pressed material to expose the LED chip, and forming a phosphor layer on the LED chip.

The method may further include cutting a plurality of LED chips into individual LED chips when the plurality of LED chips is provided.

The forming of the phosphor layer may be performed by printing a phosphor paste on the LED chip.

The forming of the phosphor layer may be performed by attaching a phosphor film on the LED chip.

The method may further include performing wire bonding for electrically connecting the substrate and the LED chip.

The material may correspond to silicone.

The method may further include, between the mounting of the LED chip and the spraying of the material, coating an insulating layer on the substrate, pressing the insulating layer with a second stamp having a patterned surface, etching the pressed insulating layer to expose a portion of the LED chip, depositing a metallic layer that connects the exposed LED chip and the substrate, and forming an electrode by removing the insulating layer.

The foregoing and/or other features and utilities of the present general inventive concept may also be achieved by providing a method of manufacturing an LED package, the method including mounting an LED chip on a wafer, spraying, on the wafer, a material used for manufacturing a reflector, and pressing the material with a first stamp having a patterned surface, using nano imprinting, forming a reflector by etching the material to expose the LED chip, and forming a phosphor layer on the LED chip.

The foregoing and/or other features and utilities of the present general inventive concept may also be achieved by providing a method of manufacturing a light emitting device (LED) package, the method including forming a reflector with a patterned surface according to nano imprinting to correspond to an LED chip to increase reflectivity of light emitted from the LED chip, and forming a phosphor layer on the reflector and the LED chip.

The method may include forming the LED chip on one of a wafer and a substrate, and forming the reflector with the patterned surface on the one of the wafer and the substrate.

The method may include forming a reflector material on the LED chip and the one of the wafer and the substrate; pressing the reflector material with a first stamp with a surface corresponding to the pattern surface against the reflector material to form the reflector using the nano imprinting, and etching the pressed reflector material to form the reflector.

The method may include forming an uneven surface as the patterned surface.

The method may include forming a minute structure having a size ranging between a nano millimeter and a micro millimeter.

The method may include forming a conductive line to electrically connect on the LED chip and the one of the wafer and the substrate.

The method may include forming a hole in the phosphor layer to provide a space to accommodate a conductive line to connect the LED chip and the one of the wafer and the substrate.

The method may include attaching a phosphor film on the LED chip and the reflector to form the phosphor layer.

The foregoing and/or other features and utilities of the present general inventive concept may also be achieved by providing a light emitting device (LED) package formed according to a method of forming a reflector with a patterned surface according to nano imprinting to correspond to an LED chip to increase reflectivity of light emitted from the LED chip, and forming a phosphor layer on the reflector and the LED chip.

BRIEF DESCRIPTION OF THE DRAWINGS

These and/or other features and utilities of the present general inventive concept will become apparent and more readily appreciated from the following description of the embodiments, taken in conjunction with the accompanying drawings of which:

FIGS. 1A through 1H are cross-sectional views illustrating a method of manufacturing a light emitting device (LED) package according to an embodiment of the present general inventive concept;

FIGS. 2A through 2G are cross-sectional views illustrating a method of manufacturing an LED package according to an embodiment of the present general inventive concept;

FIGS. 5A, 5B, and 5C are views of a surface of a reflector of an LED package according to an embodiment of the present general inventive concept.

DETAILED DESCRIPTION OF THE EMBODIMENTS

Figure 1B:
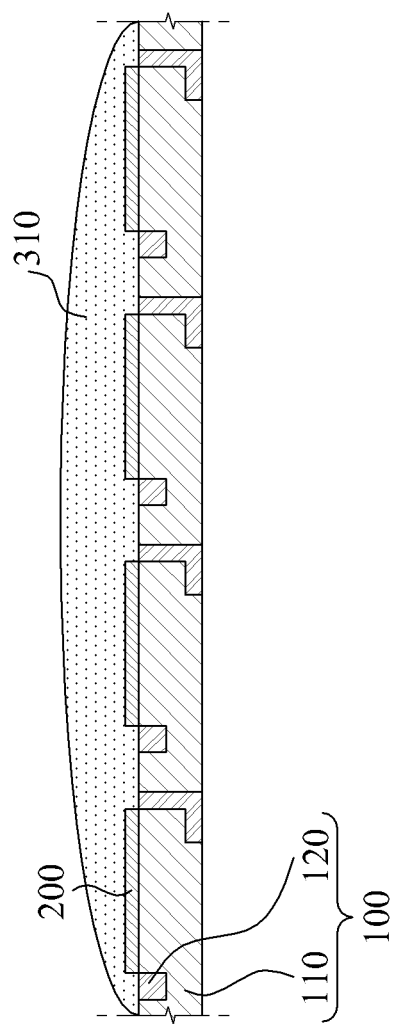
Figure 1C:
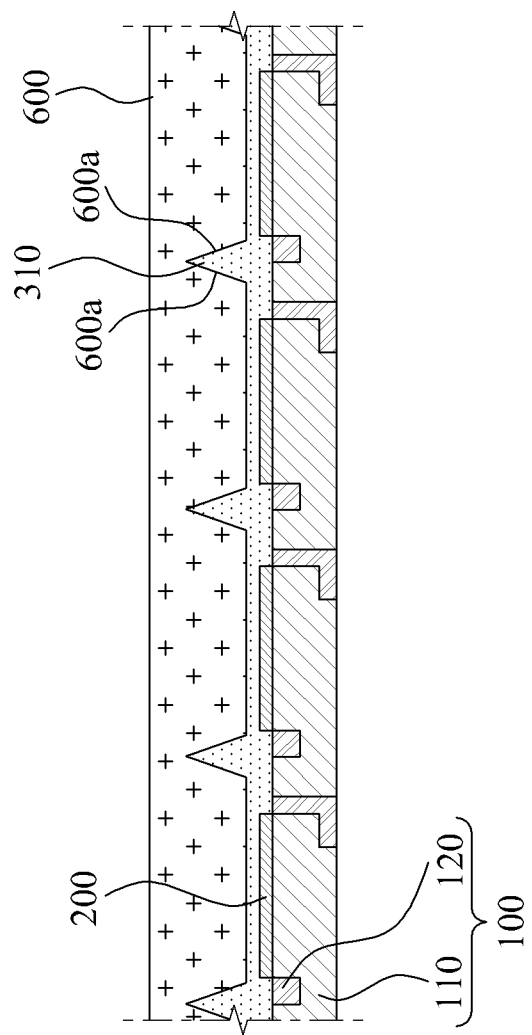

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Throughout the specification, when it says that each of a layer, a side, a chip, and the like is formed "on" or "under" a layer, a side, a chip, and the like, the term "on" may include "directly on" and "indirectly on by interposing another element therebetween," and the term "under" may include "directly under" and "indirectly under by interposing another element therebetween." A standard for "on" or "under" of each element may be determined based on a corresponding drawing.

A size of each element in drawings may be exaggerated for ease of description, and may not indicate a size to actually be applied.

Hereinafter, a method of manufacturing a light emitting device (LED) package according to example embodiments of the present invention will be described in detail with reference to the accompanying drawings.

FIGS. 1A through 1H, 2A through 2G, 3A through 3H, and 4A through 4L are cross-sectional views illustrating methods of manufacturing an LED package according to embodiments of the present general inventive concept.

The LED package manufacturing method according to an embodiment of the present general inventive concept may include mounting an LED chip 200 on a substrate 100, spraying, on the substrate 100, a reflector material 310 usable to manufacture a reflector, and pressing the reflector material 310 with a first stamp 600 having a patterned surface using nano imprinting, forming a reflector 300 by etching the pressed reflector material 310 to expose the LED chip 200, and forming a phosphor layer 500 on the LED chip 200.

Referring to FIG. 1A, the LED chip 200 may be mounted on the substrate 100. The substrate 100 may include a conductive portion 110 and an isolation portion 120 and 130 usable to isolate the conductive portion 110. The LED chip 200 may be mounted on the conductive portion 110 of the substrate 100. The LED chip 200 may be mounted to the substrate 100 directly, or may be mounted using a bump, and the like.

Referring to FIG. 1B, the reflector material 310 may be sprayed on the substrate 100. The reflector material 310 may correspond to a transparent material. For example, the material 310 may correspond to silicone, but is not limited thereto. That is, the reflector material 310 may include any material that reflects light emitted from the LED chip 200.

Referring to FIG. 10, the reflector material 310 may be pressed with the first stamp 600 having a patterned surface using nano imprinting. The nano imprinting may correspond to a technology to form a new minute pattern, such as stamping. In the nano imprinting, patterns having a minute line width may be generated using a stamp including an uneven surface of a nano level, for example, 1 to 100 nanometers (nm). When the nano imprinting is used, a minute pattern at a level corresponding to about 10 nm may be readily manufactured. The nano imprinting may be applied to various patterning processes by adjusting a size of a pattern or an uneven surface of a stamp. Referring back to FIG. 10, the first stamp 600 having a patterned surface 600a may be prepared, and the reflector material 310 may be pressed with the first stamp 310. In this instance, a shape and an angle of the reflector 300 may be determined when a pattern, formed in the first stamp 600, is filled with the reflector material 310. That is, the angle of the reflector 300 may be adjusted depending on the pattern of the first stamp 600. A surface 310a of the stamped reflector material 310 may have a pattern to correspond to the patterned surface of the first stamp 600. Accordingly, by manufacturing a reflector using the nano imprinting, a minute structure having a size ranging from a micro unit to a nano unit may be manufactured with high precision.

Figure 1D:
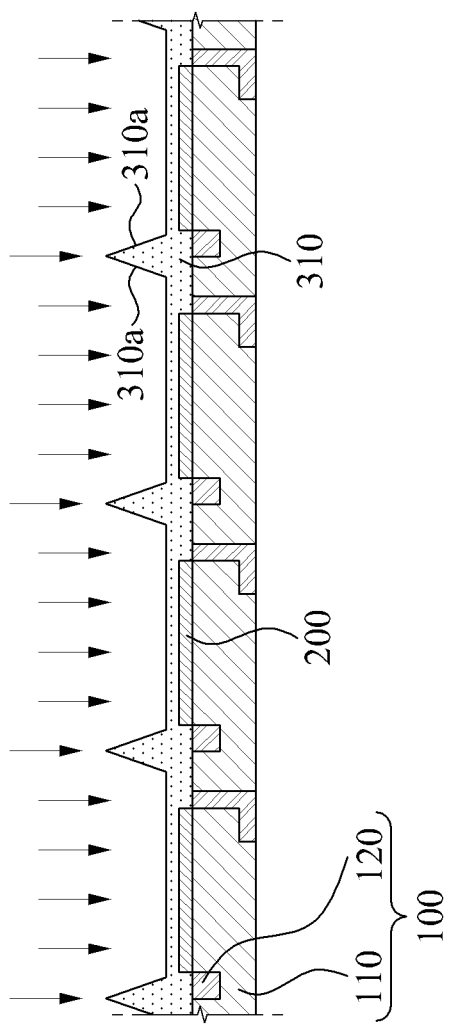

Referring to FIG. 1D, the first stamp 600 may be removed. The reflector material 310 having a shape corresponding to the pattern of the first stamp 600 may be hardened by applying heat. In the hardening process, a range of temperature may be changed depending on intrinsic characteristics of the reflector material 310. For example, when the reflector material 310 corresponds to silicone, the temperature may correspond to a temperature in the range of about 100° C. to about 200° C.

Referring to FIG. 1E, the pressed reflector material 310 may be etched using reactive ion etching (RIE) to expose a front surface of the LED chip 200, and the reflector 300 may be formed. A size of the reflector 300 may be set to be extremely (relatively) small, for example, less than 100 micrometers (μm). Accordingly, in the LED package manufacturing method according to an embodiment of the present general inventive concept, the shape, size, and angle of the reflector may be adjusted depending on a pattern formed on a surface of the first stamp. A surface 300a of the reflector 300 may have a pattern to correspond to the patterned surface of the first stamp 600.

Figure 1F:
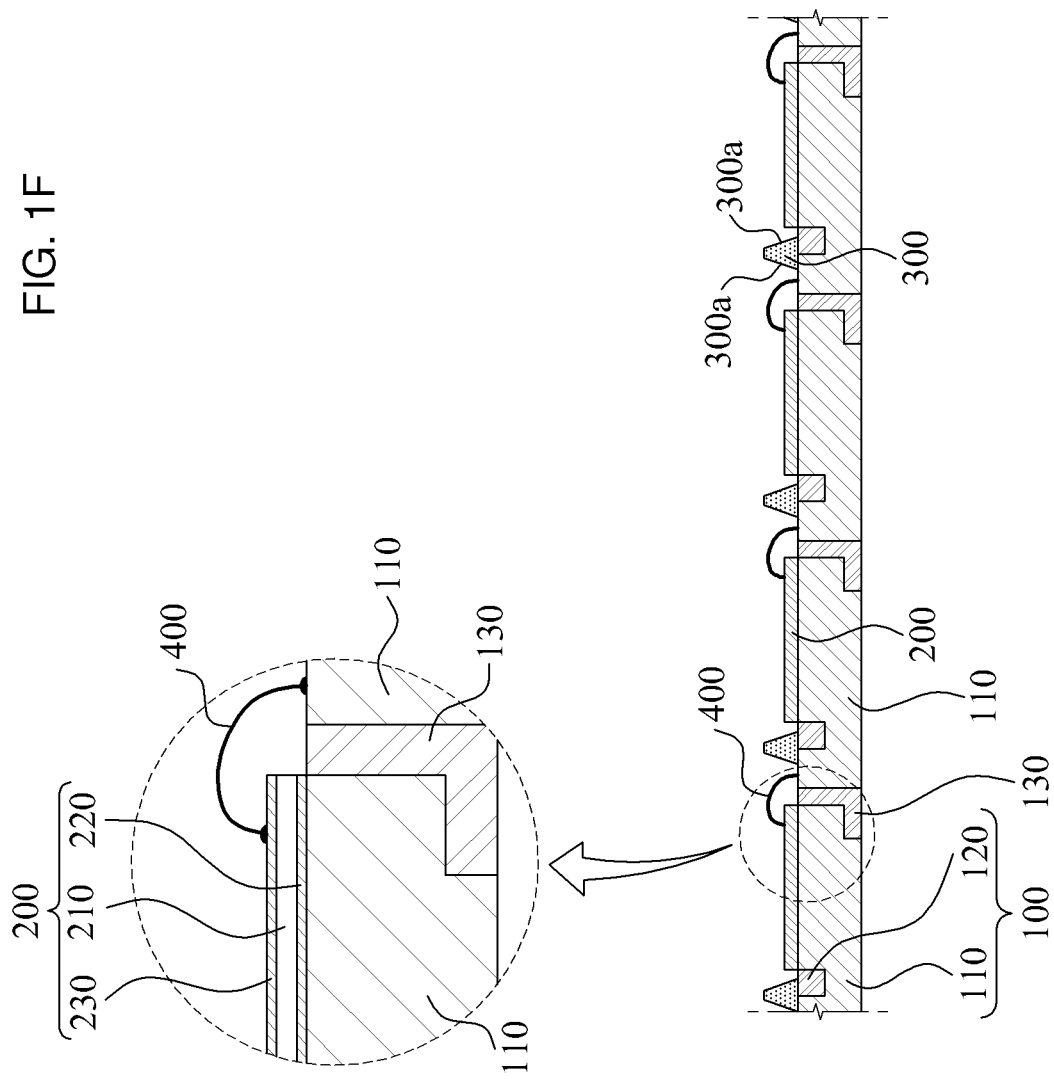

Referring to FIG. 1F, the LED chip 200 and the substrate 100 may be connected using wire bonding. A wire 400 may act as an electrical path by connecting an electrode (not illustrated) formed in the LED chip 200 and the substrate 100. The substrate 100 may have an electrical unit having a conductive line and/or a circuit to drive the LED chip 200 or to supply a power to the LED chip 200. To partially enlarge the drawing, the LED chip 200 includes a semiconductor structure 210, a lower electrode 220, and an upper electrode 230, which may form a vertical structure in which the upper electrode 230 and the lower electrode 220 are disposed at an upper portion and a lower portion of the semiconductor structure 210, respectively. The lower electrode 220 may be bonded to the conductive portion 110. The upper electrode 230 may be electrically connected to the conductive portion 110 by the wire 400. In this case, the conductive portion 110 to which the wire 400 is connected may be disposed at one side of the conductive portion 110, to which the LED chip 200 is mounted, and electrically insulated by the isolation portion 130.

Referring to FIG. 1G, a phosphor paste 510 is applied and/or printed on the LED chip and/or the reflector 300 to form the phosphor layer 500 on the LED chip 200 and/or the reflector 300. In this instance, the phosphor paste 510 may be hardened by applying heat to form the phosphor layer 500 after the phosphor paste 510 is applied and/or printed on the LED chip 200. During the hardening process, a temperature range may be suitably changed depending on a material characteristic of the phosphor paste 510.

Referring to FIG. 1H, a plurality of LED packages formed on the substrate 100 may be cut into individual LED chips 200. In detail, the substrate 100 may be cut with reference to the reflector 300 surrounding the individual LED chips 200. A scheme of cutting the plurality of LED packages may correspond to a mechanical scheme, but is not limited thereto.

Thus, an LED package manufactured by the method according to an embodiment of the present general inventive concept may increase an intensity of light extracted toward an external environment by increasing an angle of a reflector. Here, although the angle of the reflector increases, a size of the LED package may not increase. Also, by manufacturing a reflector having a height and width corresponding to a size of an LED chip depending on a pattern formed on a surface of the first stamp, a loss of light resulting from an increase in a scattering path may be reduced. In addition, a shape and an angle of the reflector may be varyingly adjusted, by changing a shape of the pattern formed on the surface of the first stamp.

When light is emitted from one or more LEDs, a first portion of light is directly output through the phosphor layer 500 and a second portion of the light is incident on the surface 300a of the reflector 300 and then reflected to an outside of the LED chip package through the phosphor layer 500.

The reflector 300 may be formed on the isolation portion 120 or the conductive portion 110. The formed reflector 300 may be separated to provide the surface 300a to each separated reflector 300 as illustrated in FIG. 1H.

FIGS. 2A through 2G illustrates a method of manufacturing an LED package according to another embodiment of the present general inventive concept.

In FIGS. 2A through 2G, a process of forming a reflector 300 after mounting an LED chip 200 on a substrate 100 is similar to the process described with reference to FIGS. 1A through 1E. Accordingly, detail descriptions thereof will be omitted and a process of forming a phosphor layer will be described hereinafter.

Figure 2B:
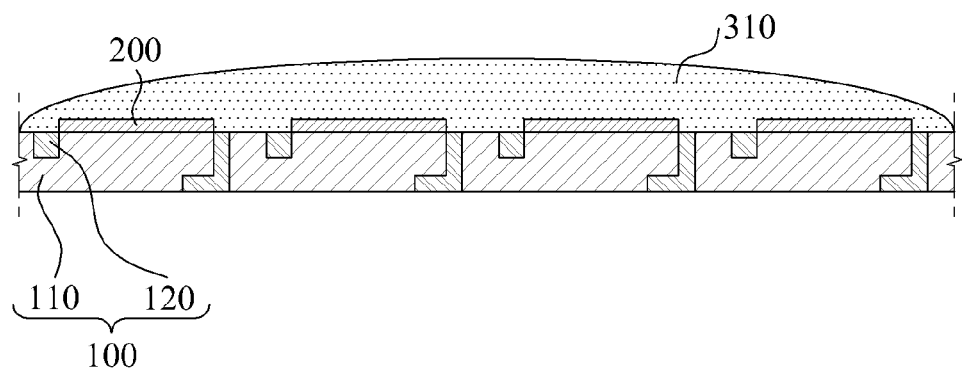
Figure 2C:
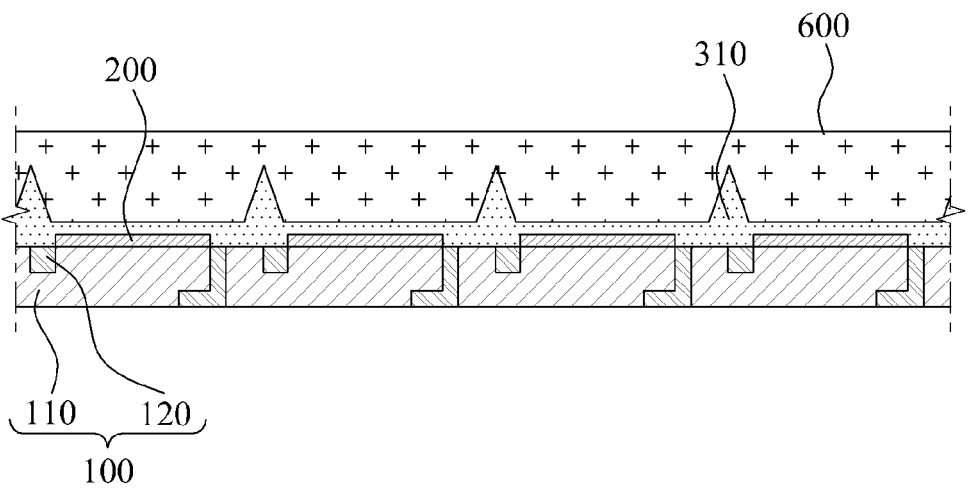
Figure 2D:
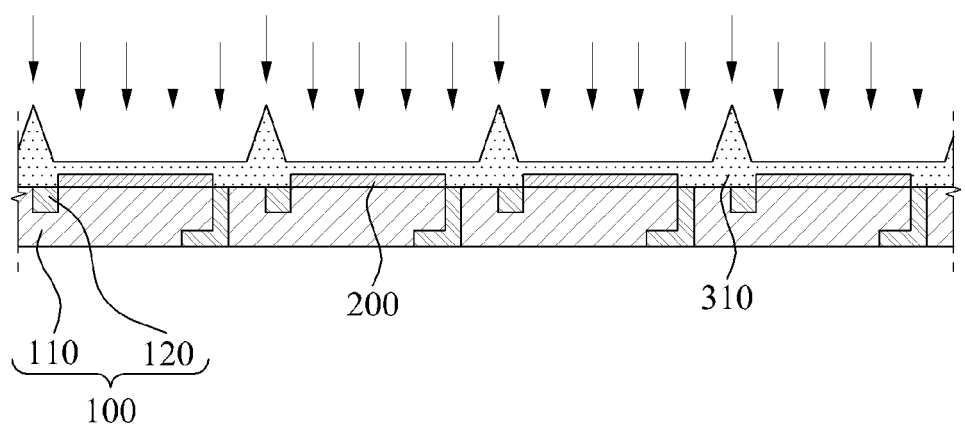
Figure 2E:
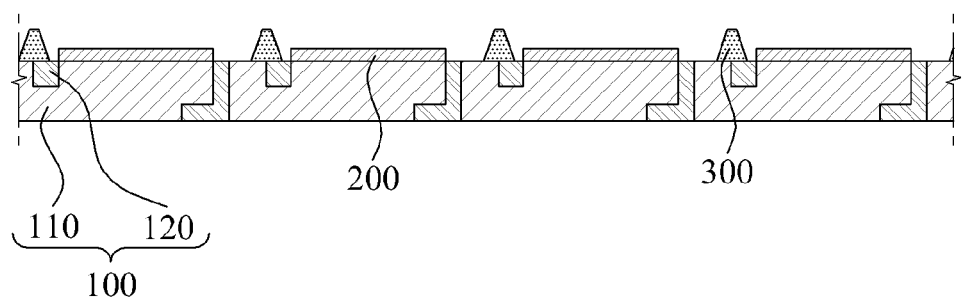
Figure 2F:
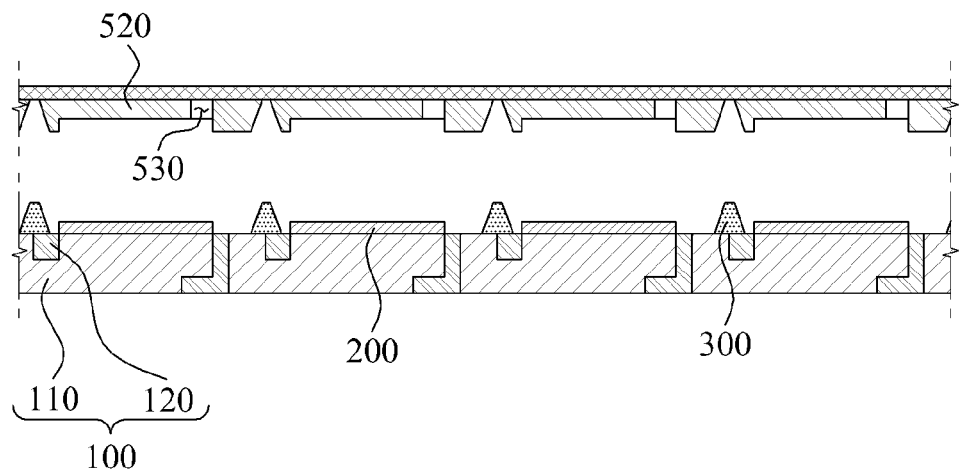

Referring to FIG. 2F, a phosphor film 520 may be attached to a unit of the substrate 100, the LED chip 200, and the reflector 300 in order to form a phosphor layer 500 on the LED chip 200. In this instance, a hole 530 may be formed in the phosphor film 520 for a wire bonding process, to be described hereinafter. Also, the phosphor film 520 may be hardened by applying heat to the phosphor layer 500 after the phosphor film 520 is attached onto the LED chip 200. During the hardening process, a temperature range may be suitably changed depending on the phosphor film 520 used. The phosphor film 520 may be fixed to an ultraviolet film, and may be attached to the LED chip 200 and the reflector 300 by radiating an ultraviolet ray and applying heat.

Figure 2G:
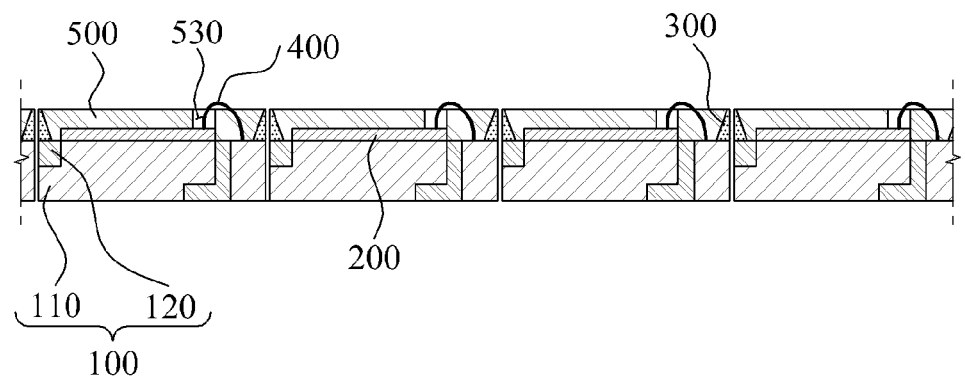
Figure 3A:
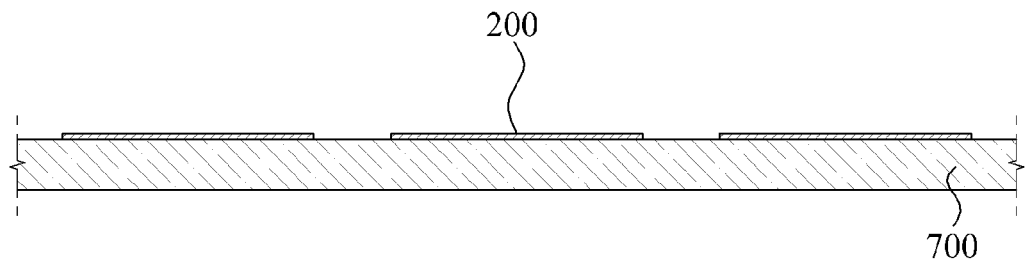
FIGS. 3A through 3H are cross-sectional views illustrating a method of manufacturing an LED package according to an embodiment of the present general inventive concept.
Figure 3B:
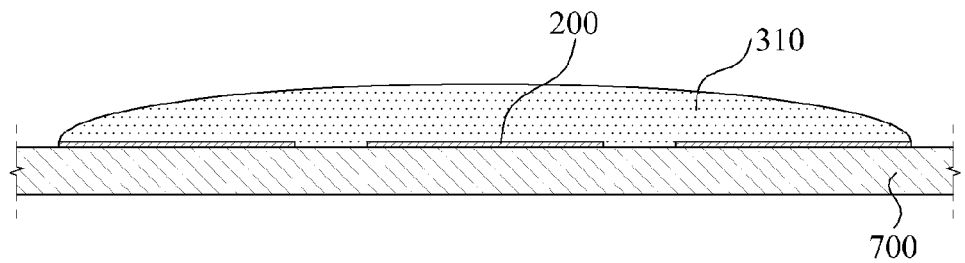
Figure 3C:
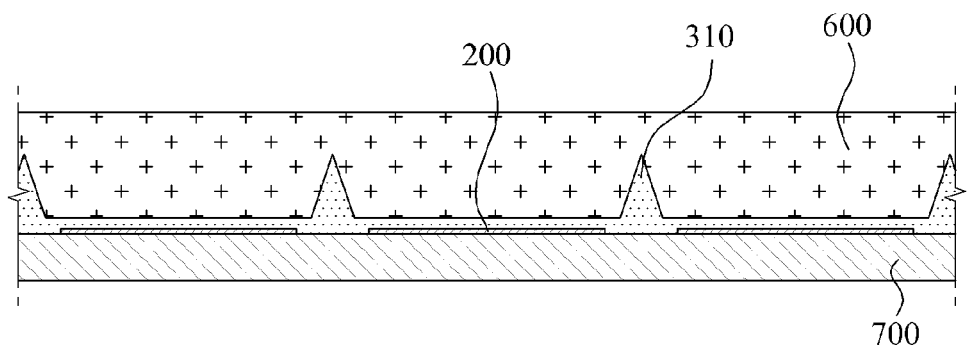
Figure 3D:
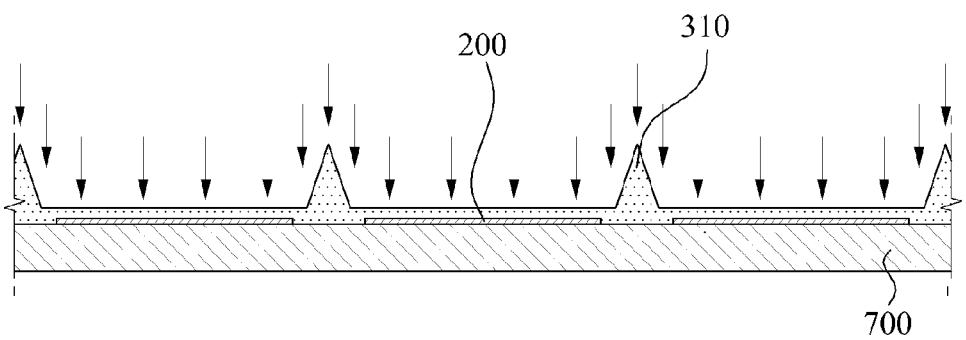
Figure 3E:
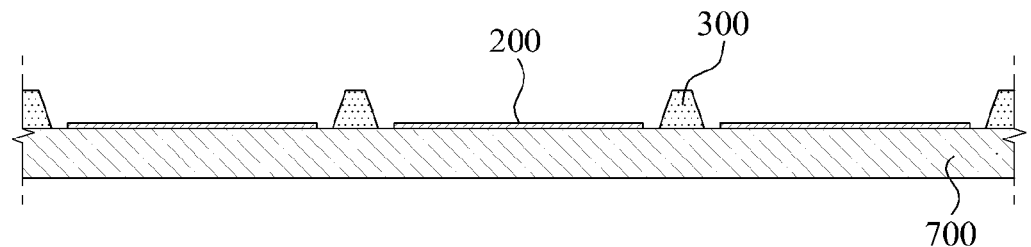
Figure 3F:
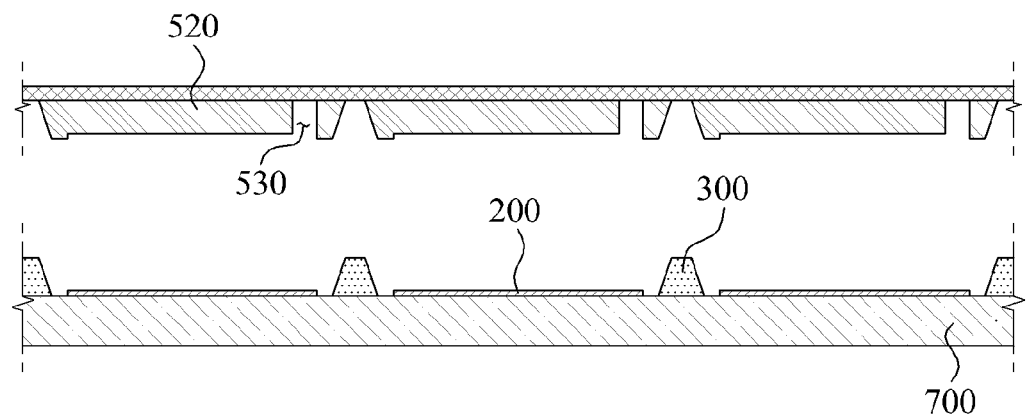
Figure 3G:
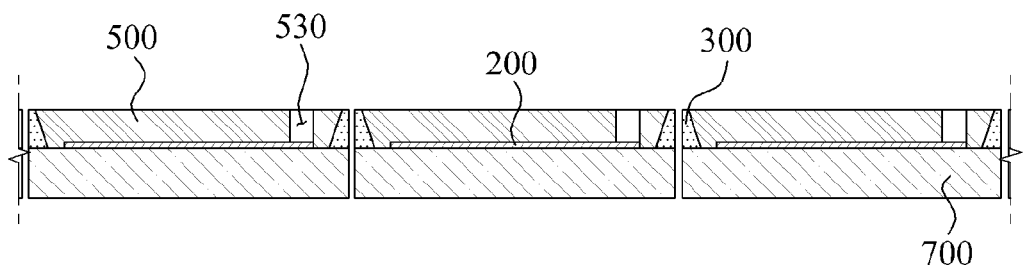
Figure 3H:
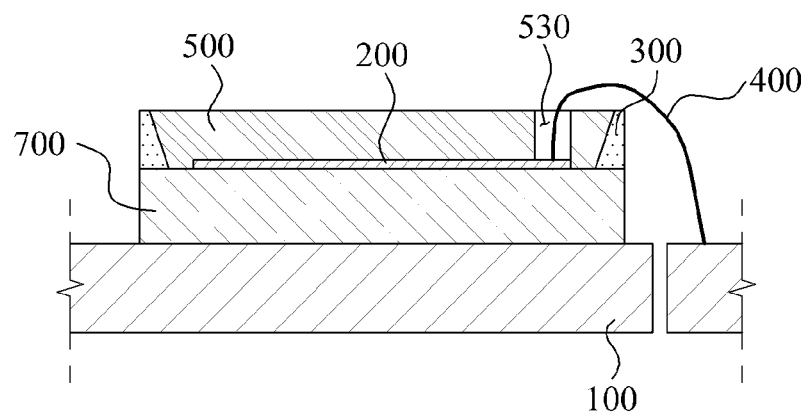

Referring to FIG. 2G, the LED chip 200 and the substrate 100 may be connected, using wire bonding for inserting the wire 400 through the hole 530. The wire 400 is disposed to connect the LED chip 200 and the substrate 100. Then, a plurality of LED packages formed on the substrate 100 may be cut into individual LED chips 200. A scheme of cutting the plurality of LED packages may correspond to a mechanical scheme, but the scheme is not limited thereto.

FIGS. 3A through 3H illustrates a method of manufacturing an LED package, including forming a reflector at a wafer level, according to an embodiment of the present general inventive concept.

Referring to FIGS. 3A through 3H, an LED chip 200 may be mounted on a wafer 700 compared to the process of FIGS. 1A-1H and 2A-2G to mount the LED chip 200 on the substrate 100. A reflector material 310 usable to manufacture a reflector may be sprayed on the wafer 700. For example, the reflector material 310 may correspond to silicone.

A first stamp 600 having a patterned surface may be prepared. The reflector material 310 may be pressed with the first stamp 600. The first stamp 600 may be removed. The reflector material 310 having a shape corresponding to the pattern of the first stamp 600 may be hardened by applying heat. In this instance, an angle of a reflector 300 may be adjusted depending on the pattern of the first stamp 600. That is, in order to form a minute pattern at a level corresponding to about 10 nm, using nano imprinting that is usable for generating patterns having a minute line width, the material 310 may be pressed with the first stamp 600 having the patterned surface. Using the nano imprinting, a minute pattern of a nanoscale size may be manufactured easily. The nano imprinting may be applied to various patterning processes by adjusting a size of a pattern or an uneven surface of a stamp.

Then, the pressed reflector material 310 may be etched using reactive-ion etching (RIE) to expose a front surface of the LED chip 200, and the reflector 300 may be formed.

A phosphor film 520 may be attached to form a phosphor layer 500 on the LED chip 200, and the phosphor film 520 may be hardened by applying heat to form the phosphor layer 500. In this instance, a hole 530 may be formed in the phosphor film 520 for a wire bonding process, to be described hereinafter. Then, a plurality of LED packages formed on the wafer 700 may be cut into individual LED chips 200. A substrate 100 may be prepared for the cut LED package, and the LED chip 200 and the substrate 100 may be connected by a wire using wire bonding to connect the LED chip 200 to the substrate 100.

In the LED package manufacturing method according to the still other embodiment of the present invention, an LED package, which may increase an intensity of light extracted toward an external environment by increasing an angle of a reflector, may be formed on a wafer directly, thereby productivity may increase when the LED package is mass-produced, and a process may be simplified.

FIGS. 4A through 4L illustrate a method of manufacturing an LED package, in which a wire bonding process is omitted, according to yet another embodiment of the present general inventive concept. The method of FIGS. 4A through 4L is similar to the above-described method except a wire bonding process. Accordingly, detain descriptions thereof will be omitted, and a process of forming an electrode to connect an LED chip and a substrate will be described hereinafter.

In FIGS. 4A through 4L, the wire bonding process may be omitted by adding a process of forming an electrode 920 after mounting an LED chip 200 on a substrate 100.

Figure 4A:
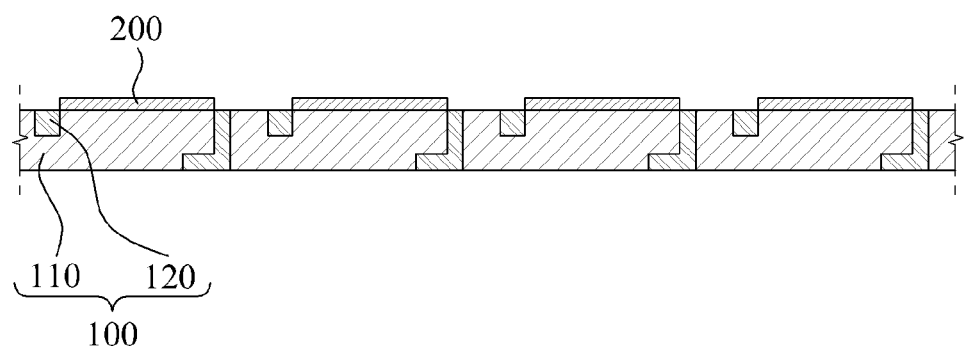
FIGS. 4A through 4L are cross-sectional views illustrating a method of manufacturing an LED package according to an embodiment of the present general inventive concept.

Referring to FIG. 4A, the LED chip 200 may be mounted on the substrate 100. The substrate 100 may include a conductive portion 110 and an isolation portion 120 usable to isolate the conductive layer 110. The LED chip 200 may be mounted on the conductive portion 110 of the substrate 100.

Figure 4B:
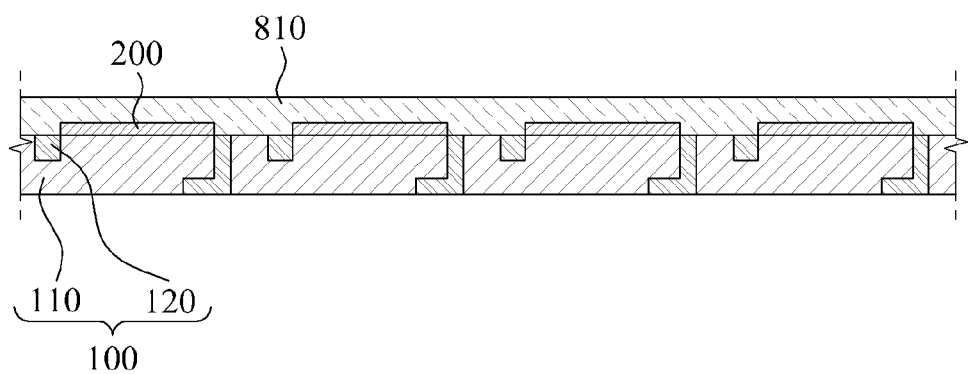

Referring to FIG. 4B, a resist 810 corresponding to an insulating material may be applied on the substrate 100. The insulating material may include thermoplastic, for example, polymethylmethacrylate (PMMA), liquid crystal polymer (LCP), polycyclohexylene dimethyl terephthalate (PCT), polyethylene terephthalate (PET), and the like, but is not limited thereto. Also, the insulating material may be applied using various schemes, for example, spin coating, and the like.

Figure 4C:
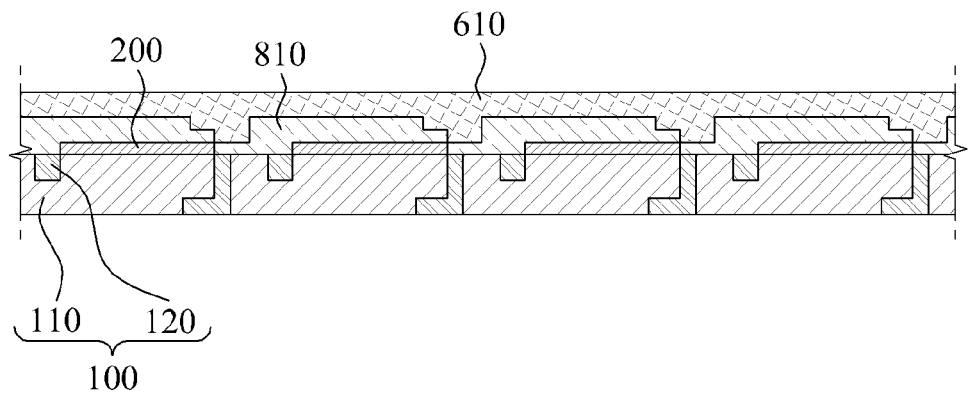

Referring to FIG. 4C, a second stamp 610 having a patterned surface may be prepared. The resist 810 may be pressed with the second stamp 610. In this instance, a shape of the resist 810 may be determined depending on a shape corresponding to the pattern formed in the second stamp 610. A step shape may be formed in the resist 810.

Figure 4D:
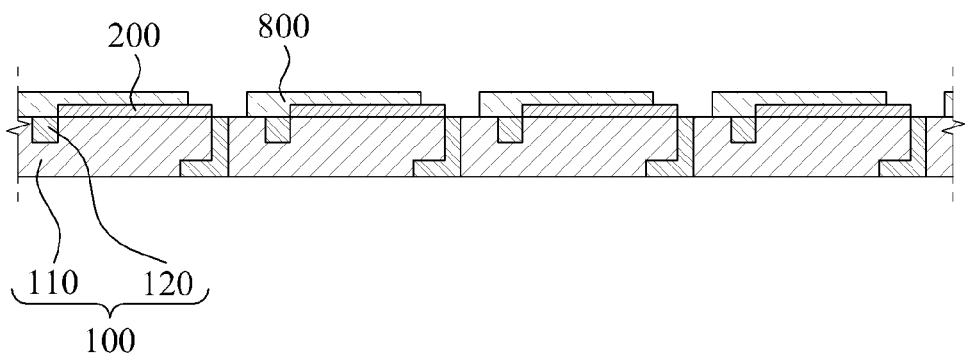

Referring to FIG. 4D, the second stamp 610 may be removed. An insulating layer 800 may be formed by etching the pressed resist 810 using RIE, and a portion of the LED chip 200 may be exposed.

Figure 4E:
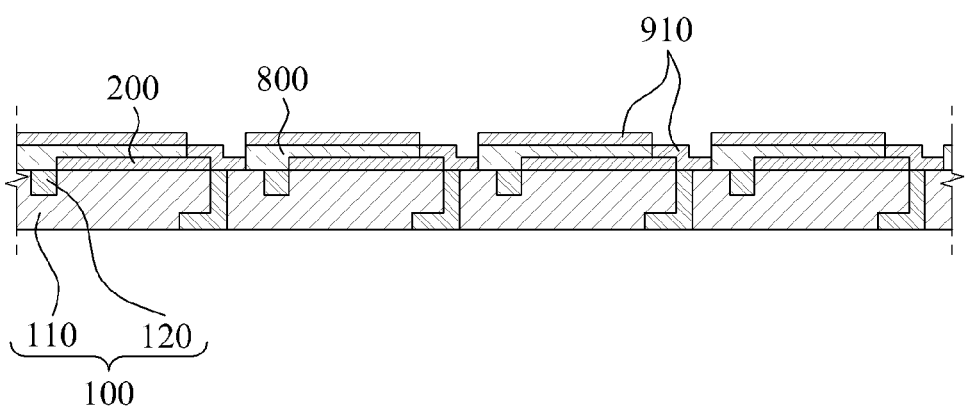

Referring to FIG. 4E, a metallic layer 910 may be deposited on the insulating layer 800 and the exposed portion of the LED chip 200. The metallic layer 910 deposited on the exposed portion of the LED chip 200 may act as the electrode 920 to connect the LED chip 200 and the substrate 100.

Figure 4F:
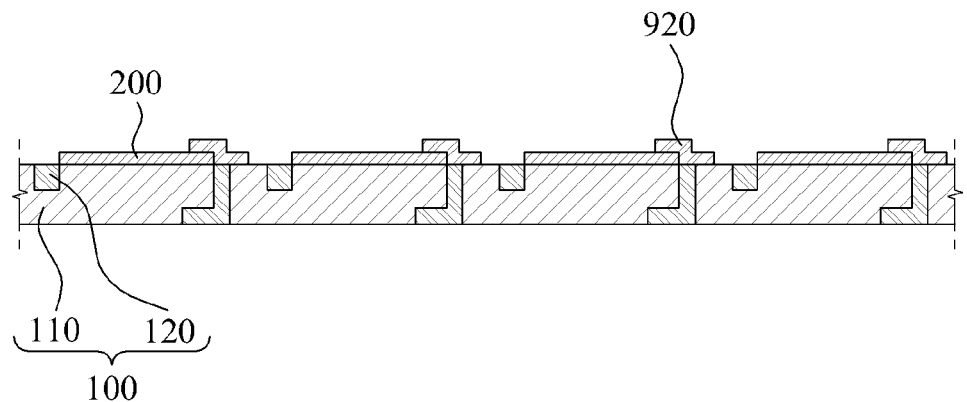
Figure 4G:
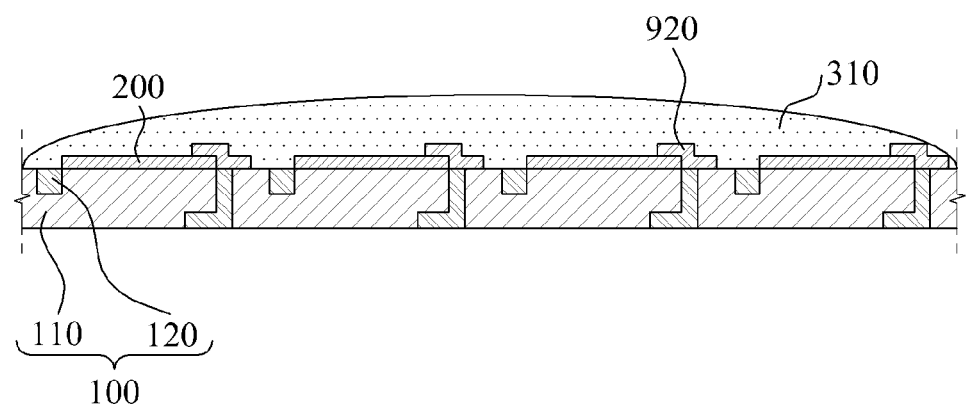
Figure 4H:
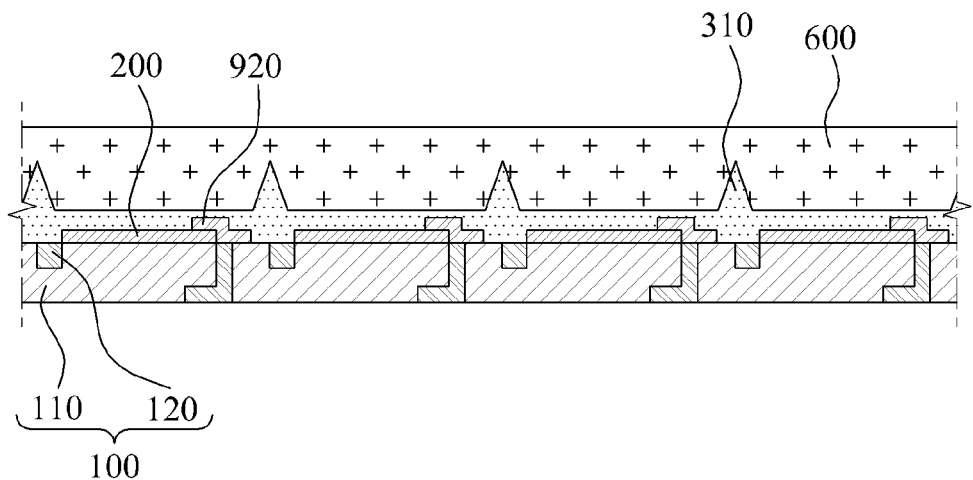
Figure 4I:
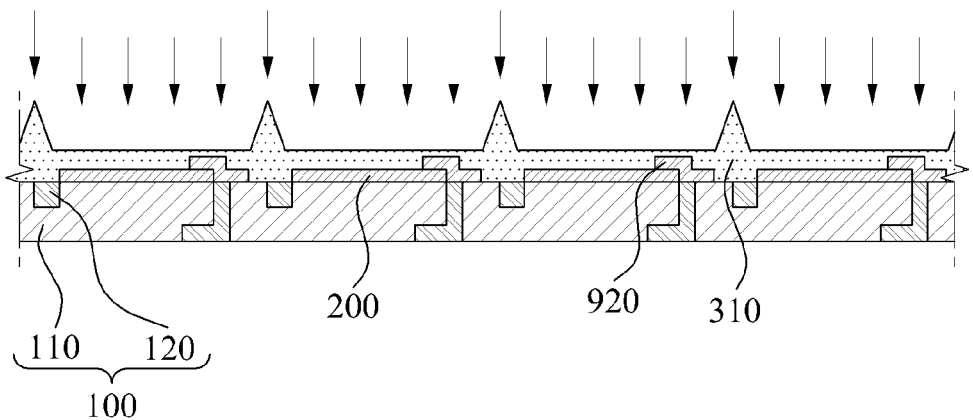
Figure 4J:
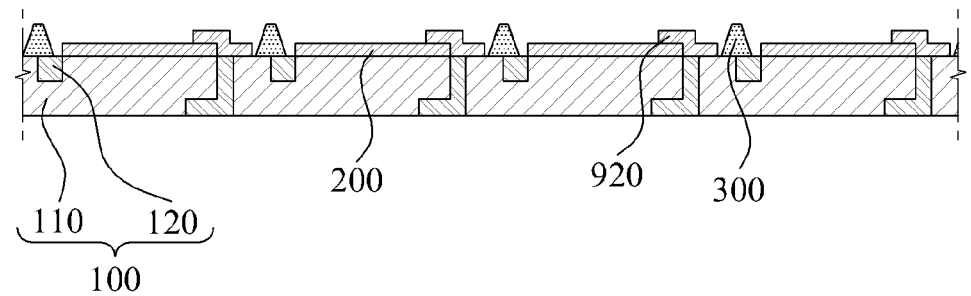
Figure 4K:
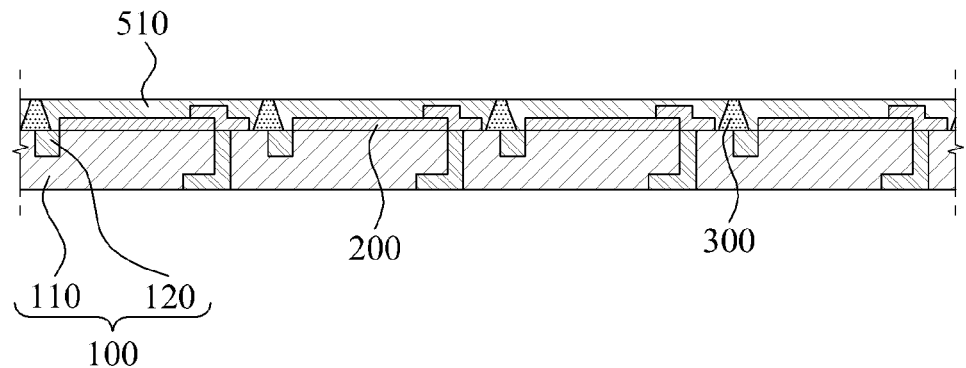
Figure 4L:
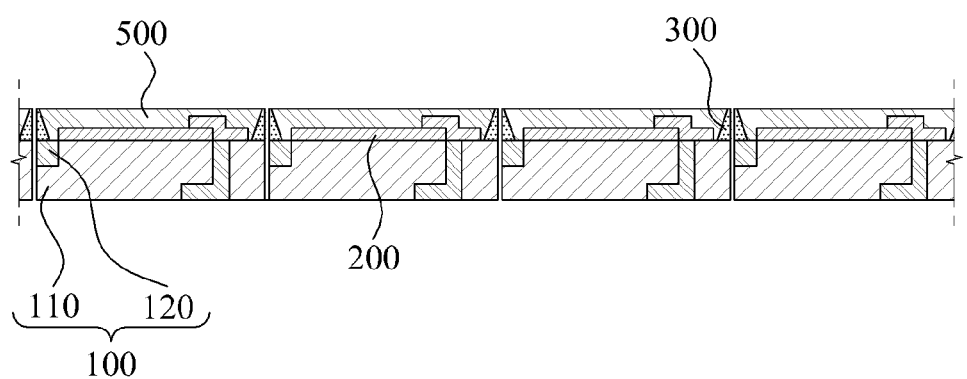

Referring to FIG. 4F, the electrode 920 may be formed by removing the insulating layer 800 and the metallic layer 910 formed on the insulating layer 800, excluding the metallic layer 910 acting as the electrode 920 to connect the LED chip 200 and the substrate 100, using a lift-off scheme.

FIGS. 4G through 4L illustrates a process performed after the electrode 920 is formed, which is similar to the process in FIGS. 1B through 1H, from which the wire bonding process is excluded. Thus, simple descriptions will be provided.

A reflector material 310 may be sprayed on the substrate 100. For example, the reflector material 310 may correspond to silicone.

A first stamp 600 having a patterned surface may be prepared. The material 310 may be pressed with the first stamp 600. The first stamp 600 may be removed. The material 310 having a shape corresponding to the pattern of the first stamp 600 may be hardened by applying heat. In this instance, an angle of a reflector 300 may be adjusted depending on the pattern of the first stamp 600.

The pressed reflector material 310 may be etched using the RIE to expose a front size of the LED chip 200 and to form the reflector 300.

A phosphor layer 500 may be formed on the LED chip 200 by applying and printing a phosphor paste 510 on the LED chip 200. In this instance, the phosphor paste 510 may be hardened by applying heat to the phosphor layer 500 after the phosphor paste 510 is applied and printed on the LED chip 200. In the hardening process, a range of temperature may be suitably changed depending on the phosphor paste 510 used.

A plurality of LED packages formed on the substrate 100 may be cut into individual LED chips 200.

Figure 5B:
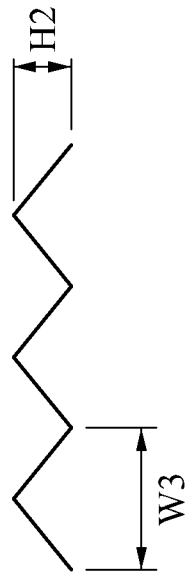

As illustrated in FIGS. 5A, 5B, and 5C, the patterned surface of the reflector may have a plurality of grooves each having dimensions of widths W1, W2, W3, W4, and W5 and heights H1, H2, and H3 between a nanometer and a micrometer, for example. Widths W1 and W2.

In the LED package manufacturing method according to the yet other embodiment of the present general inventive concept, a wire bonding process for connecting an LED chip and a substrate may be omitted, and thereby a manufacturing cost may be reduced through the simplified process. Also, when a phosphor film is used to form a phosphor layer, a hole may not need to be formed in the phosphor film and thus, the following process of forming the phosphor layer, and other processes may be performed easily.

According to example embodiments of the present general inventive concept, a subminiature silicone reflector may be formed at a substrate level or a wafer level, using nano imprint lithography. Thus, an intensity of light extracted toward an external environment may increase by increasing an angle of the reflector to increase reflection efficiency. Here, although the angle of the reflector increases, a size of an LED package may not increase. Also, by manufacturing the LED package at a wafer level, productivity may increase when the LED package is mass-produced, and a process may be simplified.

In addition, by manufacturing a reflector having a height and width corresponding to a size of an LED chip depending on a pattern formed on a surface of a first stamp, loss of light resulting from an increase in a scattering path may be reduced. Also, a shape and an angle of the reflector may be adjusted diversely, by changing a shape of the pattern formed on the surface of the first stamp.

According to an embodiment of the present general inventive concept, a minute structure having a size ranging from a micro unit to a nano unit may be manufactured with high precision, by manufacturing a reflector and an electrode using nano imprinting. Also, since the reflector and the electrode may be applied at a wafer level and may not require expensive lithography equipment, it may be economical in reducing a manufacturing cost.

Although a few exemplary embodiments of the present general inventive concept have been shown and described, the present invention is not limited to the described exemplary embodiments. Instead, it would be appreciated by those skilled in the art that changes may be made to these exemplary embodiments without departing from the principles and spirit of the general inventive concept, the scope of which is defined by the claims and their equivalents.

What is claimed is:

1. A method of manufacturing a light emitting device (LED) package, the method comprising:
   mounting an LED chip on a substrate;
   coating an insulating layer on the substrate;
   pressing the insulating layer with a first stamp having a patterned surface;
   etching the pressed insulating layer to expose a portion of the LED chip;
   depositing a metallic layer that connects the exposed LED chip and the substrate;
   forming an electrode by removing the insulating layer;
   spraying, on the substrate, a reflector material;
   pressing the sprayed reflector material with a second stamp having a patterned surface, using nano imprinting;
   forming a reflector to have a pattern corresponding to the patterned surface of the second stamp by etching the pressed reflector material to expose the LED chip; and
   forming a phosphor layer on the LED chip.

2. The method of claim 1, further comprising:
   cutting a plurality of LED chips into individual single LED chips when the plurality of LED chips is provided.

3. The method of claim 1, wherein the forming of the phosphor layer is performed by printing a phosphor paste on the LED chip.

4. The method of claim 1, wherein the forming of the phosphor layer is performed by attaching a phosphor film on the LED chip.

5. The method of claim 1, further comprising:
   performing wire bonding for electrically connecting the substrate and the LED chip.

6. The method of claim 1, wherein the reflector material corresponds to silicone.

7. The method of claim 1, wherein the substrate includes a conductive portion and an isolation portion to isolate the conductive portion.

8. The method of claim 1, wherein the substrate on which the LED chip is mounted is a first substrate, and the method further comprises:
   cutting a plurality of LED packages on the first substrate with reference to the reflector when a plurality of LED chips is provided;
   mounting at least one of the cut LED packages on a second substrate; and
   performing wire bonding for electrically connecting the second substrate and the LED chip.

9. A method of manufacturing a light emitting device (LED) package, the method comprising:
   forming an LED chip on one of a substrate
   coating an insulating layer on the substrate;
   pressing the insulating layer with a first stamp having a patterned surface;
   etching the pressed insulating layer to expose a portion of the LED chip;
   depositing a metallic layer that connects the exposed portion of the LED chip and the substrate;
   forming an electrode by removing the insulating layer;
   forming a reflector by spraying a reflector material to surround the LED chip and pressing the sprayed reflector material with a second stamp having a patterned surface according to nano imprinting to increase reflectivity of light emitted from the LED chip; and
   forming a phosphor layer on the reflector and the LED chip.

10. The method of claim 9, wherein the forming of the reflector further comprises:
    etching the pressed reflector material to form the reflector.

11. The method of claim 9, wherein the forming of the reflector further comprises:
    forming an uneven surface as the patterned surface.

12. The method of claim 9, wherein the forming of the reflector further comprises:
    forming a minute structure having a size ranging between a nanometer and a micrometer.

13. The method of claim 9, wherein the forming of the phosphor layer comprises:
    forming a conductive line to electrically connect on the LED chip and one of a wafer and the substrate.

14. The method of claim 9, wherein the forming of the phosphor layer comprises:
    forming a hole in the phosphor layer to provide a space to accommodate a conductive line to connect the LED chip and one of a wafer and the substrate.

15. The method of claim 9, wherein the forming of the phosphor layer comprises:
    attaching a phosphor film on the LED chip and the reflector to form the phosphor layer.

* * * * *

UNITED STATES PATENT AND TRADEMARK OFFICE
CERTIFICATE OF CORRECTION

PATENT NO.        : 9,178,122 B2
APPLICATION NO.   : 13/672010
DATED             : November 3, 2015
INVENTOR(S)       : Jung Hoon Kim Page 1 of 1

It is certified that error appears in the above-identified patent and that said Letters Patent is hereby corrected as shown below:

On the title page item 71 should read as follows:

Applicant: Samsung Electronics Co., Ltd., Suwon-si (KR)

Signed and Sealed this
Twenty-third Day of February, 2016

Michelle K. Lee
*Director of the United States Patent and Trademark Office*